United States Patent
Knychalski et al.

(10) Patent No.: US 12,010,810 B2
(45) Date of Patent: Jun. 11, 2024

(54) EXTENDABLE CABLE ENCLOSURE

(71) Applicant: Ortronics, Inc., New London, CT (US)

(72) Inventors: Thomas Knychalski, Wakefield, RI (US); Daniel M. Smith, Westerly, RI (US); Ryan J. Grandidge, Wakefield, RI (US)

(73) Assignee: Legrand DPC, LLC, West Hartford, CT (US)

( * ) Notice: Subject to any disclaimer, the term of this patent is extended or adjusted under 35 U.S.C. 154(b) by 302 days.

(21) Appl. No.: 17/136,274

(22) Filed: Dec. 29, 2020

(65) Prior Publication Data

US 2022/0210941 A1    Jun. 30, 2022

(51) Int. Cl.
    *H05K 7/14*    (2006.01)
(52) U.S. Cl.
    CPC ................................. *H05K 7/1491* (2013.01)
(58) Field of Classification Search
    CPC .................................................... H05K 7/1491
    USPC ......................................................... 312/290
    See application file for complete search history.

(56) References Cited

U.S. PATENT DOCUMENTS

| | | | | |
|---|---|---|---|---|
| 6,373,695 | B1* | 4/2002 | Cheng | G06F 1/187 |
| 6,398,041 | B1* | 6/2002 | Abbott | H05K 7/1489 |
| | | | | 361/829 |
| 6,464,085 | B1* | 10/2002 | Chin | G11B 33/128 |
| 7,364,244 | B2* | 4/2008 | Sandoval | H05K 7/1421 |
| | | | | 312/334.46 |
| 7,911,785 | B2* | 3/2011 | Coglitore | G06F 1/183 |
| | | | | 312/334.46 |
| 8,565,572 | B2* | 10/2013 | Krampotich | G02B 6/4446 |
| | | | | 385/135 |
| 9,681,574 | B1* | 6/2017 | Chen | H05K 7/1489 |
| 10,126,516 | B1 | 11/2018 | Krampotich et al. | |
| 10,376,055 | B2* | 8/2019 | Chen | H05K 7/183 |
| 10,563,429 | B1* | 2/2020 | Bailey | E05B 35/008 |
| 2002/0134531 | A1* | 9/2002 | Yanagida | G06F 1/20 |
| | | | | 165/80.3 |
| 2005/0025444 | A1* | 2/2005 | Barnes | A47B 88/906 |
| | | | | 385/135 |
| 2009/0067800 | A1* | 3/2009 | Vazquez | A47B 46/00 |
| | | | | 385/135 |

(Continued)

FOREIGN PATENT DOCUMENTS

CN    108027635 A    5/2018
EP    21216467.7    12/2021

OTHER PUBLICATIONS

Extended European Search Report dated May 23, 2022 for European Patent Application No. 21216467.7.

*Primary Examiner* — James O Hansen
(74) *Attorney, Agent, or Firm* — McCarter & English, LLP (57) ABSTRACT

An example cable enclosure is provided that includes a chassis, a front cover coupled to the chassis, and first and second slide rails slidably coupled relative to the chassis. The cable enclosure includes a first release lever mounted to the chassis. The first release lever is capable of being positioned into a first position and a second position. In the first position, the first release lever engages the chassis to prevent sliding of the chassis and the front cover relative to the first and second slide rails. In the second position, the first release lever disengages the chassis to allow for sliding of the chassis and the front cover relative to the first and second slide rails.

22 Claims, 8 Drawing Sheets

(56) References Cited

U.S. PATENT DOCUMENTS

| | | | |
|---|---|---|---|
| 2009/0310929 A1* | 12/2009 | Reinhardt | G02B 6/4453 |
| | | | 385/135 |
| 2010/0310225 A1* | 12/2010 | Anderson | H04Q 1/06 |
| | | | 385/135 |
| 2011/0317971 A1* | 12/2011 | Zhang | H04Q 1/06 |
| | | | 385/135 |
| 2011/0317974 A1 | 12/2011 | Krampotich et al. | |
| 2018/0224621 A1* | 8/2018 | Campbell | G02B 6/445 |

\* cited by examiner

EXTENDABLE CABLE ENCLOSURE

BACKGROUND

Datacenters generally include racks with standardized 1U, 2U and 4U spaces configured to receive enclosures of corresponding sizes. Traditional enclosures for cables, such as fiber optic cables, can include a door at the front surface that can be opened and closed to provide hand access to the interior of the enclosure. However, such hand access is limited to the height of the enclosure. For example, a 1U enclosure provides an opening having a height of about 1.75 inches through which cables can be accessed by the user after the front door has been opened.

In some instances, enclosures can include one or more inner trays capable of partially sliding out of the enclosure to provide additional access to the cables within the enclosure, particularly as cable density in enclosures increases. However, the inner trays and numerous connection points within the enclosure can result in additional pinch points that can damage cables, and even slightly injure the user's fingers. Sliding inner trays also increase the number of moving parts associated with the enclosure assembly, potentially increasing maintenance and/or manufacturing costs. In addition, sliding trays generally necessitate slack in the stored cable to allow for extension of the inner tray relative to the enclosure.

SUMMARY

Embodiments of the present disclosure provide an exemplary cable enclosure includes one or more release levers that allow for selective sliding or retraction of the enclosure relative to lateral slide rails. The release levers further allow for selective opening and closing of the front cover relative to the chassis. The exemplary cable enclosure provides a larger opening at the front or proximal end of the enclosure for more convenient access to the interior of the enclosure. The release levers allow for the entire enclosure to be extended from a rack to which the slide rails are mounted, providing for additional access for cable management.

In accordance with embodiments of the present disclosure, an exemplary cable enclosure is provided. The cable enclosure includes a chassis, a front cover coupled to the chassis, and first and second slide rails slidably coupled relative to the chassis. The cable enclosure includes a first release lever mounted to the chassis. The first release lever is capable of being positioned into a first position and a second position. In the first position, the first release lever engages the chassis to prevent sliding of the chassis and the front cover relative to the first and second slide rails. In the second position, the first release lever disengages the chassis to allow for sliding of the chassis and the front cover relative to the first and second slide rails.

The chassis can be configured to support one or more spools for cable management or storage. The first and second slide rails can include a body with a mounting flange at a proximal end of the body. The mounting flange is configured to be secured to supports (e.g., vertical rails) associated with a rack. The cable enclosure can include a rear cover and a front door coupled to the chassis. Disengagement of the first release lever from the chassis allows for sliding of the chassis, the front cover, the rear cover, and the front door relative to the first and second slide rails.

The first release lever can include a body, a first cantilever extension extending from the body, and a second cantilever extension extending from the body. The first cantilever extension can include a first engagement tab configured to engage with a slot formed in the first slide rail. In the first position, the first engagement tab extends through the slot of the first slide rail and abuts a proximal mounting flange of the first slide rail to prevent sliding of the chassis and the front cover relative to the first and second slide rails. In the second position, the first engagement tab is retracted from the slot of the first slide rail to provide clearance between the first engagement tab and the first slide rail, allowing for sliding of the chassis and the front cover relative to the first and second slide rails.

The second cantilever extension can include a second engagement tab configured to engage with a slot formed in the front cover. The second cantilever can be positionable in a third position and a fourth position. In the third position, the second engagement tab extends through the slot of the front cover to prevent pivoting of the front cover relative to the chassis into an open position. In the fourth position, the second engagement tab is retracted from the slot of the front cover to allow for pivoting of the front cover relative to the chassis into an open position. The cable enclosure can include a spring associated with the front cover. The spring biases the front cover into the open position upon disengagement of the second engagement tab from the slot of the front cover.

The first and second cantilever extensions of the first release lever are independently actuated relative to each other. The first cantilever extension can connect to the body at a distal end of the first cantilever extension, and can include a flange at a proximal end of the first cantilever extension. The flange can extend perpendicularly from the proximal end of the first cantilever extension. The cable enclosure can include second release lever disposed on an opposing side of the chassis from the first release lever. The first release lever can engage and disengage relative to the first slide rail, and the second release lever can engage and disengage relative to the second slide rail.

In accordance with embodiments of the present disclosure, an exemplary method of cable management is provided. The method includes providing a cable enclosure. The cable enclosure includes a chassis, a front cover coupled to the chassis, first and second slide rails slidably coupled relative to the chassis, and a first release lever mounted to the chassis. The method includes positioning the first release lever into a first position to engage the first release lever with the chassis and prevent sliding of the chassis and the front cover relative to the first and second slide rails. The method includes positioning the first release lever into a second position to disengage the first release lever from the chassis to allow for sliding of the chassis and the front cover relative to the first and second slide rails.

The first release lever can include a body, a first cantilever extension extending from the body, and a second cantilever extension extending from the body. Positioning the first release lever into the first position can include extending a first engagement tab of the first cantilever extension through a slot of the first slide rail and abutting the first engagement tab against a proximal mounting flange of the first slide rail to prevent sliding of the chassis and the front cover relative to the first and second slide rails. Positioning the first release lever into the second position can include retracting the first engagement tab from the slot of the first slide rail to allow for sliding of the chassis and the front cover relative to the first and second slide rails.

The method can include positioning the second cantilever extension into a third position to insert a second engagement tab of the second cantilever extension through a slot formed in the front cover to prevent pivoting of the front cover relative to the chassis into an open position. The method can include positioning the second cantilever extension into a fourth position to retract the second engagement tab from the slot of the front cover to allow for pivoting of the front cover relative to the chassis into the open position.

In accordance with embodiments of the present disclosure, an exemplary cable enclosure system is provided. The system includes a rack including a first support structure and a second support structure, and a cable enclosure mounted to the rack. The cable enclosure includes a chassis, a front cover coupled to the chassis, and first and second slide rails slidably coupled relative to the chassis. The first slide rail can be fixedly coupled to the first support structure of the rack and the second slide rail can be fixedly coupled to the second support structure of the rack. The cable enclosure includes a first release lever mounted to the chassis. The first release lever is capable of being positioned into a first position and a second position. In the first position, the first release lever engages the chassis to prevent sliding of the chassis and the front cover relative to the first and second slide rails. In the second position, the first release lever disengages the chassis to allow for sliding of the chassis and the front cover relative to the first and second slide rails.

Any combination and/or permutation of embodiments is envisioned. Other objects and features will become apparent from the following detailed description considered in conjunction with the accompanying drawings. It is to be understood, however, that the drawings are designed as an illustration only and not as a definition of the limits of the present disclosure.

BRIEF DESCRIPTION OF THE DRAWINGS

To assist those of skill in the art in making and using the extendable cable enclosure, reference is made to the accompanying figures, wherein.

DETAILED DESCRIPTION

Figure 1:
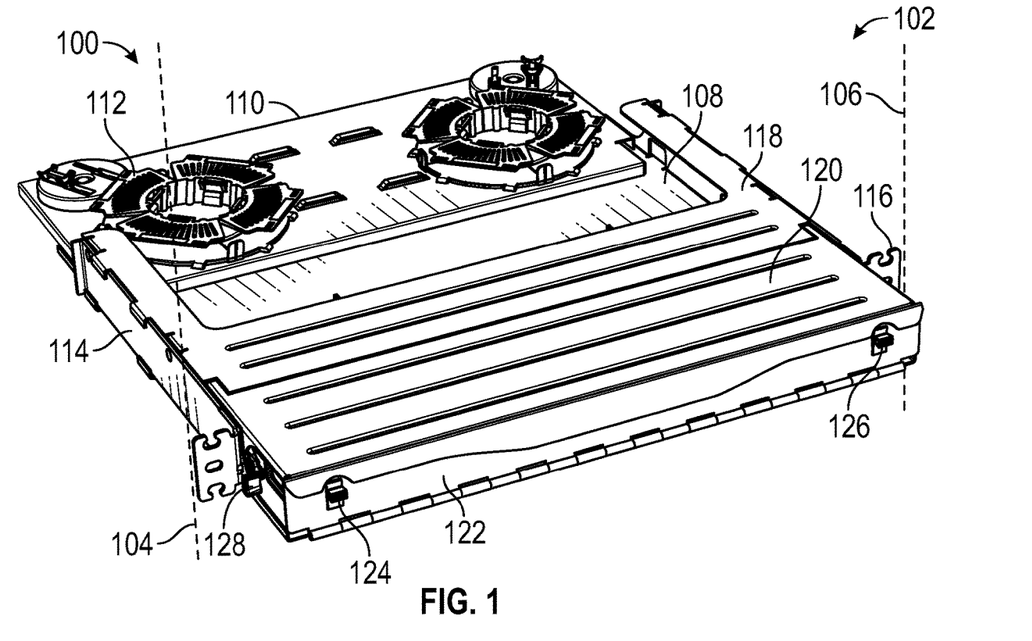
FIG. 1 is a left perspective view of an extendable cable enclosure in an exemplary embodiment.
Figure 2:
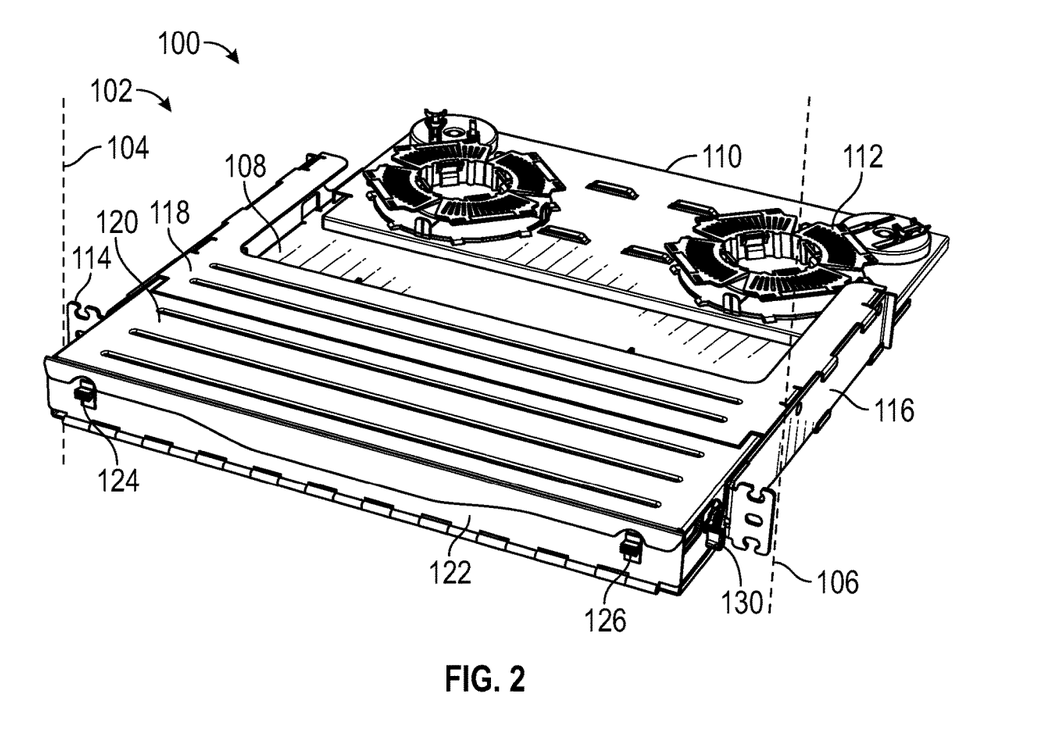
FIG. 2 is a right perspective view of the extendable cable enclosure of FIG. 1.

FIGS. 1 and 2 are perspective views of an exemplary extendable cable enclosure 100 (hereinafter "enclosure 100") of the present disclosure. The enclosure 100 is configured and dimensioned to fit within an opening between vertical rails 104, 106 (e.g., supports) of a housing or rack 102, and further be secured or mounted to the rails 104, 106. Although shown as a 1U size enclosure 100, it should be understood that the enclosure 100 can be of any size used in the industry, e.g., 1U, 2U, 4U, or the like.

The enclosure 100 can include a chassis 108 that supports a platform 110 capable of engaging one or more cable spools 112. The enclosure 100 can include first and second slide rails 114, 116, a rear cover 118, a front cover 120, and a front door 122. The slide rails 114, 116 can be mounted to the rails 104, 106 of the rack 102 to maintain the enclosure 100 secured to the rack 102. The assembly of the chassis 108, platform 110, rear cover 118, front cover 120 and front door 122 is slidably engaged with the slide rails 114, 116 to slide in and out of the rack 102 and relative to the slide rails 114, 116. Latches 124, 126 can be disengaged to independently swing open the front door 122 to access the interior of the enclosure 100 only through the front door 122.

As will be discussed in greater detail below, cantilever flanges of release levers 128, 130 (e.g., release mechanisms) positioned on either side of the chassis 108 can be selectively depressed to disengage the assembly from the slide rails 114, 116 to slide the assembly out of the rack 102, to disengage and swing open the front cover 120, or both. The release levers 128, 130 therefore allow for extension of the assembly out of the rack 102, and for opening of the front cover 120 to provide greater access into the interior of the enclosure 100. For example, in a 1U size enclosure 100, rather than the about 1.75 inch space for access, the enclosure 100 can provide about 5 inches of space for access.

Figure 3:
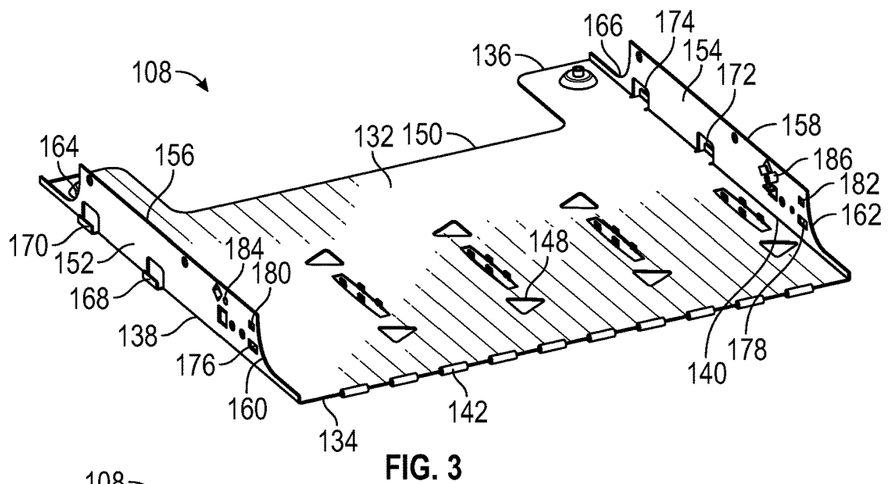
FIG. 3 is a left perspective view of a chassis of the extendable cable enclosure of FIG. 1.
Figure 4:
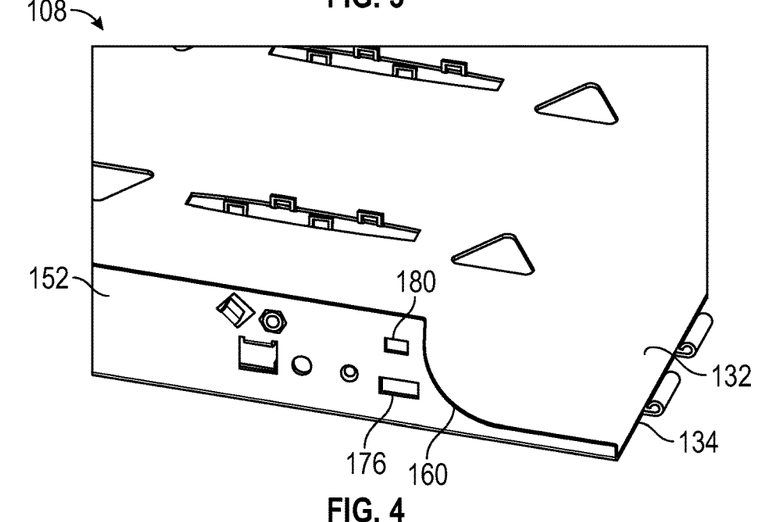
FIG. 4 is a detailed view of the chassis of FIG. 3.

With reference to FIGS. 3 and 4, a perspective and detailed views of the chassis 108 are provided. The chassis 108 includes a body or base 132 defining a substantially planar or flat configuration. The base 132 includes a front edge 134, a rear edge 136, and side or lateral edges 138, 140. The front edge 134 includes spaced knuckles 142 that are assembled with corresponding knuckles 144 extending from a bottom edge 146 of the front door 122 (see FIG. 8) to form a hinge along which the front door 122 can pivot to open and close access to the interior of the enclosure 100. The base 132 can include openings 148 formed therein to receive and engage with features for organizing patching equipment and/or cables within the enclosure 100. In some embodiments, a U-shaped cutout 150 can be formed at the rear edge 136.

The chassis 108 includes side walls 152, 154 extending substantially perpendicularly from respective lateral edges 138, 140. The side walls 152, 154 can define substantially flat or planar configurations. Each side wall 152, 154 includes a top edge 156, 158, a leading or front edge 160, 162, and a trailing or rear edge 164, 166. In some embodiments, the front and/or rear edges 160-166 can define a rounded taper towards the respective front and rear edges 134, 136 of the chassis 108. The chassis 108 includes two flanges 168-174 extending outwardly from the edges 138, 140 and side walls 152, 154. The flanges 168-174 can be formed from a portion of the side walls 152, 154, thereby leaving an opening in the side walls 152, 154 adjacent to the flanges 168-174. Each flange 168-174 can curve upwardly to define a passage or slot capable of receiving a bottom edge of the slide rails 114, 116.

Adjacent to the front edges 160, 162, each side wall 152, 154 includes a first opening or slot 176, 178 formed therein, and a second opening or slot 180, 182 formed therein. The first slot 176, 178 can be positioned closer to the edge 138, 140, and the second slot 180, 182 can be positioned closer to the top edge 156, 158. Both slots 176-182 can define a substantially rectangular configuration. However, the slot 176, 178 is dimensioned longer than the slot 180, 182, extending further towards the rear edge 164, 166 than the slot 180, 182. Holes 184, 186 formed in the side walls 152, 154 can receive pins and/or fasteners to form a pivot point for the front cover 120.

Figure 5:
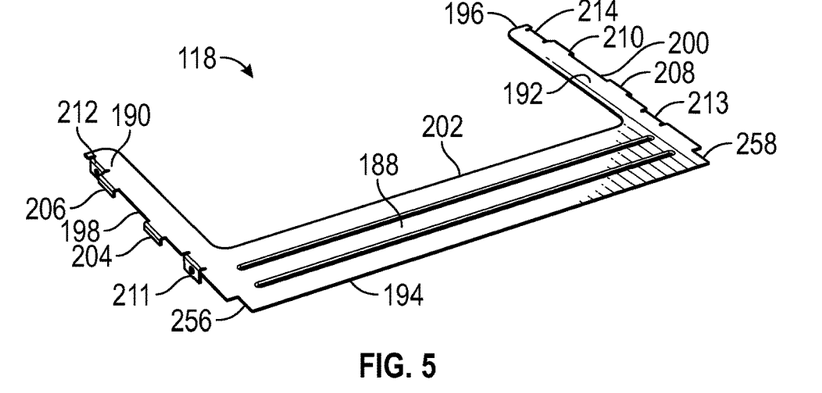
FIG. 5. is a left perspective view of a rear cover of the extendable cable enclosure of FIG. 1.

With reference to FIG. 5, a perspective view of the rear cover 118 is provided. The rear cover 118 includes a central section 188 and lateral sections 190, 192 defining a substantially planar configuration. For example, the central and lateral sections 188-192 can extend along the same plane. The rear cover 118 includes a front edge 194, a rear edge 196, and lateral or side edges 198, 200. The rear cover 118 can include a U-shaped cutout 202 formed at the rear edge 196 and extending towards the front edge 194, resulting in a substantially U-shaped configuration of the rear cover 118. The rear cover 118 includes at least two flanges 204-206, 208, 210 extending substantially perpendicularly and downwardly from the side edges 198, 200. Each flange 204-210 can at least partially curve away from the edge 198, 200, thereby defining a slot or passage configured to receive a top edge of the respective side rails 114, 116 (and the top edges 156, 158 of the chassis 108). The rear cover 118 includes fixation flanges 211, 212, 213, 214 extending downwardly from the side edges 198, 200, each flange 211-214 including an opening for securing the rear cover 118 to side walls 152, 154 of the chassis 108.

Figure 6:
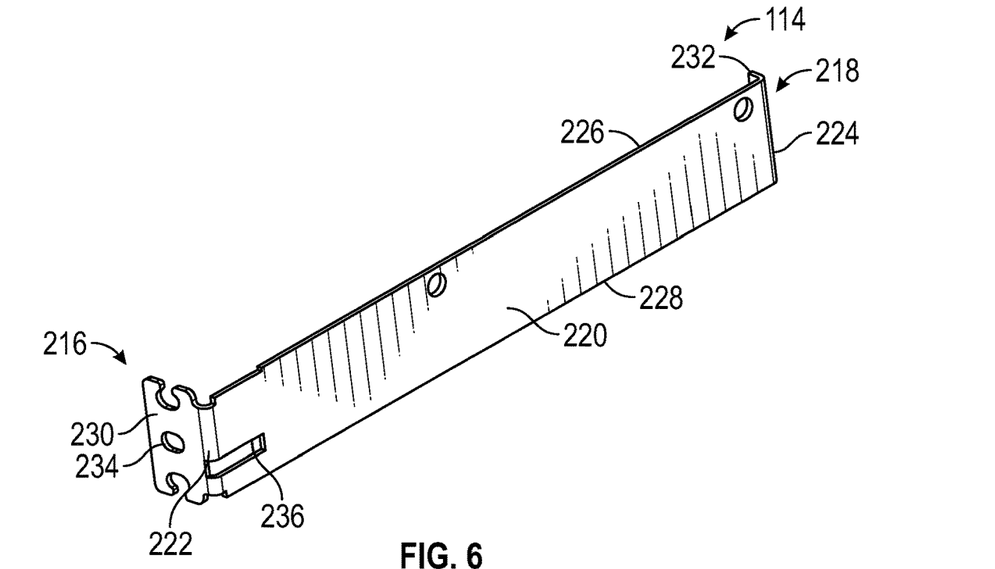
FIG. 6 is a perspective view of a slide rail of the extendable cable enclosure of FIG. 1.

With reference to FIG. 6, a perspective view of the side rail 114 is provided. It should be understood that the side rail 116 includes the same components as the side rail 114 and is a mirror image thereof. The side rail 114 includes a front or proximal end 216 and a rear or distal end 218. The side rail 114 includes a body 220 defining a substantially planar configuration extending between the proximal and distal ends 216, 218. The body 220 includes a front edge 222, a rear edge 224, a top edge 226, and a bottom edge 228. The side rail 114 includes a front flange 230 (e.g., mounting flange) extending perpendicularly from the front edge 222, and a rear flange 232 extending perpendicularly from the rear edge 224. The front and rear flanges 230, 232 extend in the same direction from the body 220, and extend substantially parallel relative to each other.

The flange 230 defines a lateral length or width dimensioned greater than the lateral length or width of the flange 232. The flange 230 includes one or more openings 234 formed therein. The openings 234 in the side rails 114, 116 can be used to fasten the enclosure 100 to the respective rails 104, 106 of the rack 102 (see, e.g., FIG. 1). The side rail 114 includes an elongated slot 236 formed in the body 220 and extending from the edge 222 towards the edge 224. The length of the slot 236 can be longer than the slot 176 formed in the chassis 108. After assembly, the front or proximal edge of the slots 236 of the side rails 114, 116 can substantially align with the front or proximal edge of the slots 176, 178 of the chassis 108. The side rails 114, 116 do not include slots or openings corresponding with the slots 180, 182 of the chassis 108.

Figure 7:
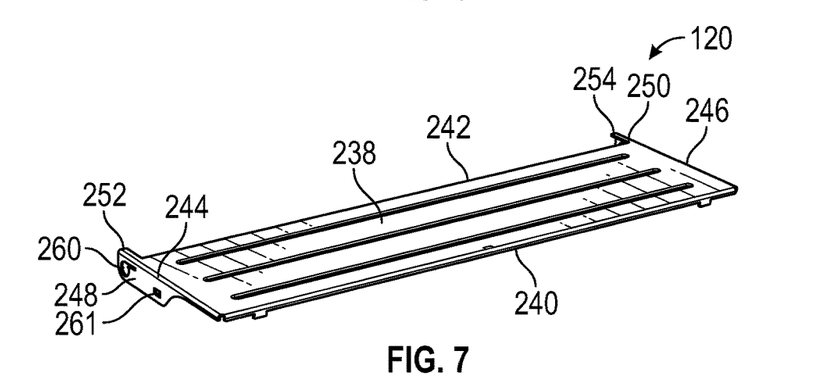
FIG. 7 is a left perspective view of a front cover of the extendable cable enclosure of FIG. 1.

With reference to FIG. 7, a perspective view of the front cover 120 is provided. The front cover 120 includes a central section 238 with a front edge 240, a rear edge 242, and lateral or side edges 244, 246. The central section 238 defines a substantially planar or flat configuration. The front cover 120 includes side flanges 248, 250 extending substantially perpendicularly and downwardly from the respective side edges 244, 246. In some embodiments, the rear ends 252, 254 of the flanges 248, 250 can extend beyond the rear edge 242 of the central section 238. In such embodiments, the corners of the front edge of the rear cover 118 can include cutouts 256, 258 complementary to the rear ends 252, 254 such that when assembled, the cutouts 256, 258 at least partially receive the rear ends 252, 254 (see, e.g., FIG. 1). Each flange 248, 250 includes an opening 260 formed therein (not visible in flange 250). When assembled, the openings 260 align with openings 184, 186 of the chassis 108 to create the pivot point of the front cover 120 relative to the chassis 108. Each flange 248, 250 includes a slot 261 formed near or at the proximal end of the flange 248, 250 (not visible for flange 250).

Figure 8:
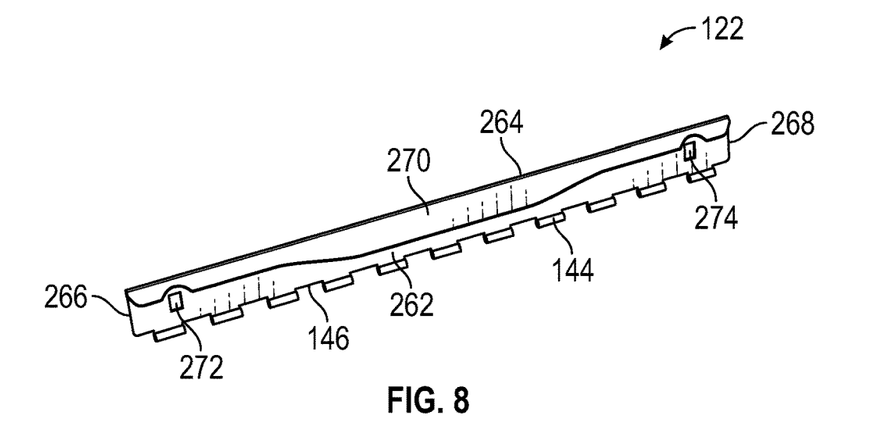
FIG. 8 is a left perspective view of a front door of the extendable cable enclosure of FIG. 1.
Figure 9:
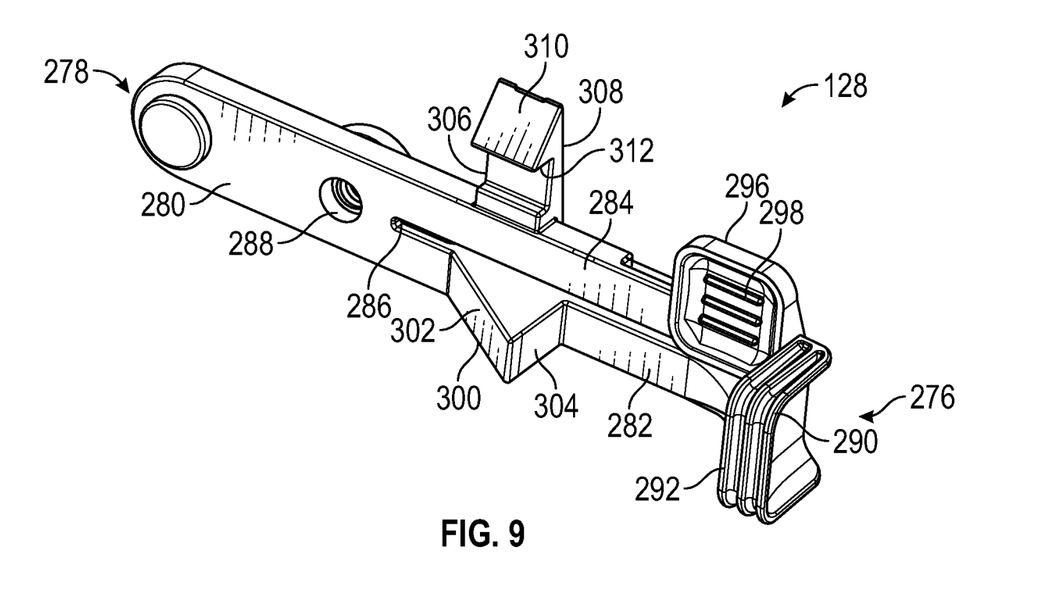
FIG. 9 is a left perspective view of a release lever of the extendable cable enclosure of FIG. 1.
Figure 10:
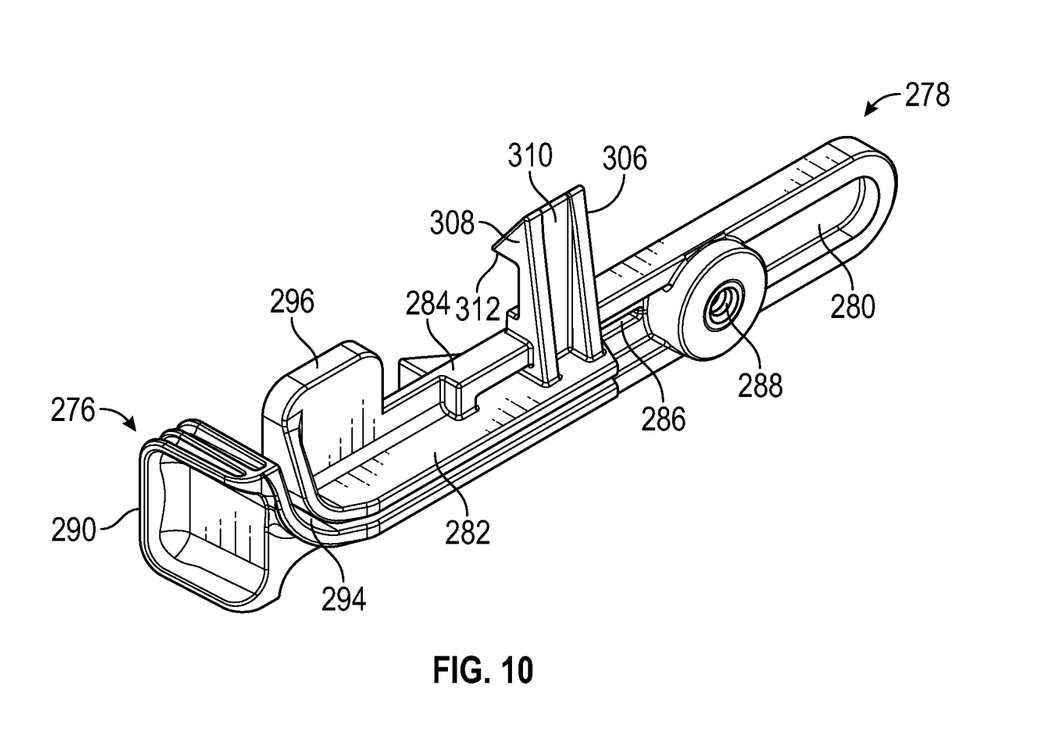
FIG. 10 is a right perspective view of the release lever of FIG. 9.
Figure 11:
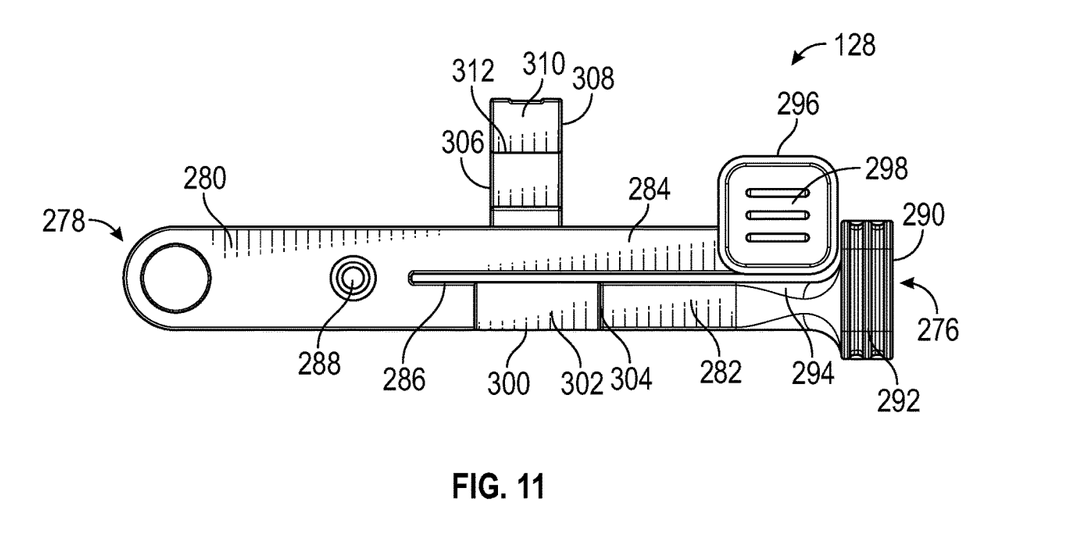
FIG. 11 is a right side view of the release lever of FIG. 9.
Figure 12:
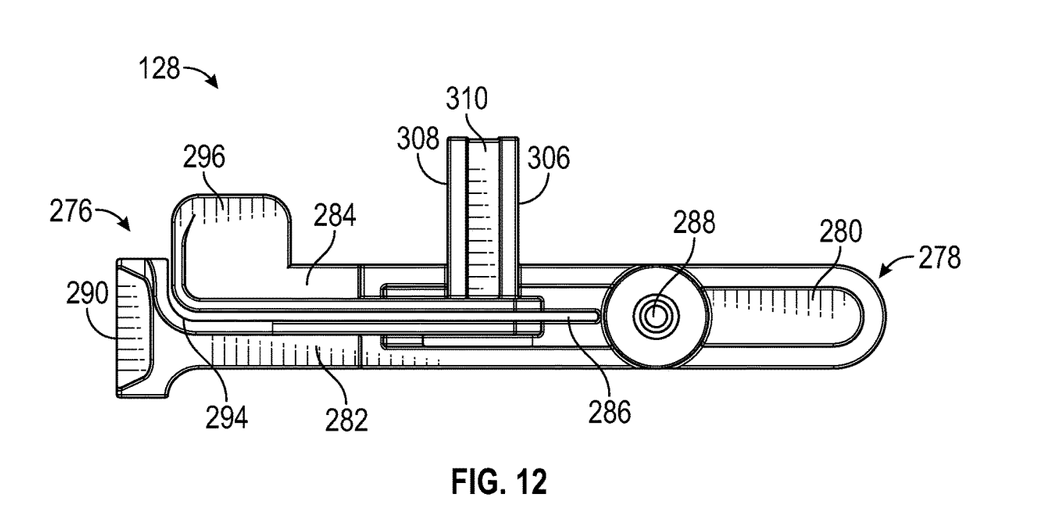
FIG. 12 is a left side view of the release lever of FIG. 9.

With reference to FIG. 8, a perspective view of the front door 122 is provided. The front door 122 includes a central door section or body 262 defining a substantially planar or flat configuration. The front door 122 includes a top edge 264, the bottom edge 146, and lateral or side edges 266, 268. In some embodiments, the front door 122 can include a lip 270 extending downwardly therefrom. The lip 270 can function as a handle for opening and closing the front door 122. The body 262 includes slots 272, 274 that receive the respective latches 124, 126. The knuckles 144 of the front door 122 align with the knuckles 140 of the chassis 108 to create a pivot axis for the front door 122 relative to the chassis 108.

With reference to FIGS. 9-12, perspective and side views of the release lever 128 are provided. It should be understood that the release lever 130 is substantially similar in structure and function to the release lever 128, and is a mirror image thereof. The release lever 128 includes a proximal end 276 and an opposing distal end 278. The release lever 128 includes a substantially solid body 280 at the distal end 278, and two cantilever extensions 282, 284 (e.g., bottom and top flanges) extending from the body 280. The extensions 282, 284 can be substantially aligned with the body 280 along the same plane. The extensions 282, 284 are separated from each other by a gap 286 such that the distal end of the extensions 282, 284 is connected to the body 280 and the proximal end of the extensions 282, 284 is free to be pivoted. The material of the release lever 128 (e.g., plastic, or the like) can provide sufficient rigidity for maintaining the structural configuration of the release lever 128, while allowing the extensions 282, 284 to be independently flexed or pivoted by the user.

The release lever 128 includes a hole 288 formed in the body 280 for securing the release lever 128 to the chassis 108. The cantilever extension 282 includes a grip or flange 290 extending substantially perpendicularly from the proximal end of the extension 282. The flange 290 can include ergonomic features 292 (e.g., ribs, texture, ridges, or the like) to provide a gripping surface to the user. The perpendicular orientation of the flange 290 relative to the extension 282 further provides a gripping edge to the user to, e.g., pull on the release lever 128 during operation of the enclosure 100. A top surface of the extension 282 can include a curved section 294 adjacent to the flange 290.

The cantilever extension 284 includes a grip or flange 296 extending from the proximal end of the extension 284. The flange 296 can include ergonomic features 298 (e.g., ribs, texture, ridges, or the like) to provide a gripping surface to the user. The ergonomic features 292, 298 of the flanges 290, 296 can assist the user in locating the flanges 292, 296 during use of the enclosure 100 without necessarily seeing the flanges 292, 296 (e.g., if cables or additional components block the user's view of the flanges 292, 296). A bottom edge of the flange 296 can be curved to substantially fit within the curved section 294 of the extension 282. The length of the extension 284 is therefore dimensioned shorter than the length of the extension 282.

The extension 282 includes an engagement tab 300 (e.g., a snap feature) extending substantially perpendicularly from the extension 282. The engagement tab 300 extends in the same direction as the flange 290. The engagement tab 300 can define a substantially triangular cross-section, including a tapered surface 302 extending away from the extension 282, and a flat engagement surface 304. As will be discussed in greater detail below, the engagement tab 300 is configured to at least partially extend through the slot 176 of the chassis 108 and the slot 236 of the slide rail 114, with the engagement surface 304 abutting the flat surface of the flange 230 to prevent extension of the enclosure 100 (except for the side rails 114, 116) out of the rack 102 (see, e.g., FIGS. 1, 13 and 14).

The extension 284 includes a perpendicular protrusion 306 extending vertically from the extension 284 between the body 280 and the flange 296. The protrusion 306 includes an engagement tab 308 (e.g., a snap feature) extending perpendicularly from the protrusion 306 in the same direction as the engagement tab 300. The engagement tab 308 includes a tapered surface 310 extending from the top edge of the tab 308, and a flat engagement surface 312. As will be discussed in greater detail below, the engagement tab is configured to extend through the slot 180 of the chassis 108 and at least partially into slot 261 of the front cover 120, with the engagement surface 312 abutting a flat edge of the slot 261 to prevent opening of the front cover 120 (see, e.g., FIGS. 1, 14 and 15).

During assembly of the enclosure 100, the platform 110 can be mounted to the chassis 108, and the rear cover 118, front cover 120 and front door 122 can be secured to the chassis 108. The front door 122 is secured to the chassis 108 such that disengagement of the latches 124, 126 allows for the front door 122 to pivot into an open position at the pivot axis formed by the knuckles 140, 144. The front cover 120 is secured to the chassis 108 at pivot points associated with holes 260 in the front cover 120, allowing the front cover 120 to pivot upwardly and away from the base 132 of the chassis 108 to provide additional access to the interior of the enclosure 100 (see, e.g., FIG. 16). The assembly includes springs 314 (e.g., torsion springs) at or near each of the pivot points for the front cover 120 (see FIG. 16). The springs 314 bias the front cover 120 into the open position. As such, when the front cover 120 is released from the locked and closed position, the spring-loaded front cover 120 is biased by the springs 314 into the fully open position shown in FIG. 16.

The release levers 128, 130 can be secured to the chassis 108. The slide rails 114, 116 can be assembled with the chassis 108 and rear cover 118, as shown in FIGS. 1-2 and 15-16. In particular, the chassis 108 and rear cover 118 are assembled over the slide rails 114, 116, such that the flanges of the chassis 108 and rear cover 118 are positioned over and around the top and bottom edges 226, 228 of the slide rails 114, 116. Such assembly maintains the slide rails 114, 116 secured to the remaining components of the enclosure 100, while allowing the entire enclosure 100 to slide relative to the slide rails 114, 116. It should be understood that when discussing sliding of the enclosure 100 relative to the rack 102, use of the term "entire enclosure" or "enclosure" refers to all components of the enclosure 100 except for the slide rails 114, 116, which remain fixed to the rails 104, 106.

Figure 13:
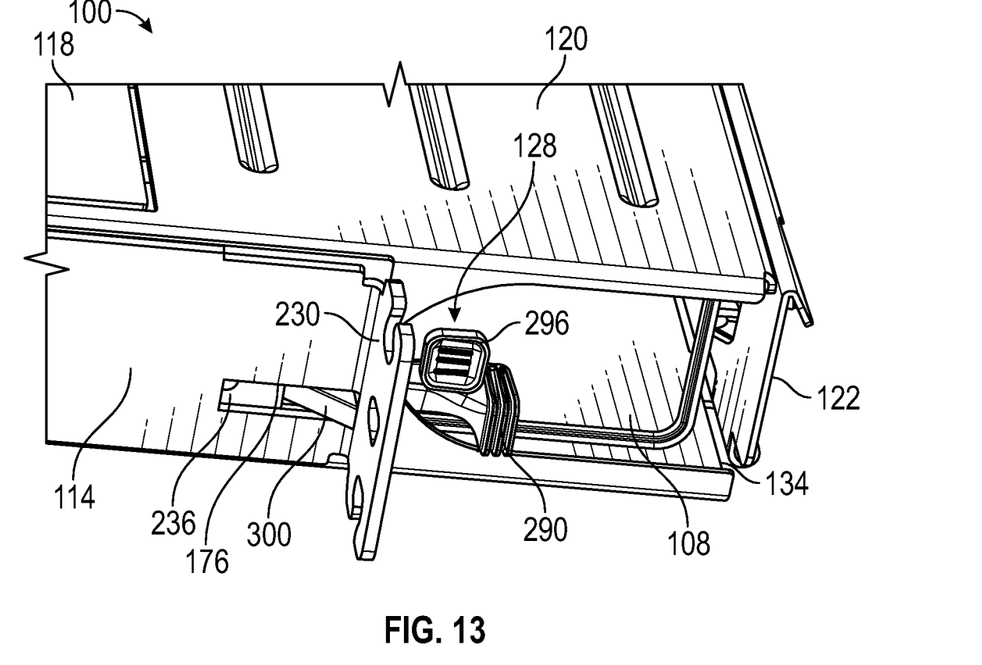
FIG. 13 is a detailed view of the extendable cable enclosure of FIG. 1, including the release lever engaged with the slide rail.
Figure 14:
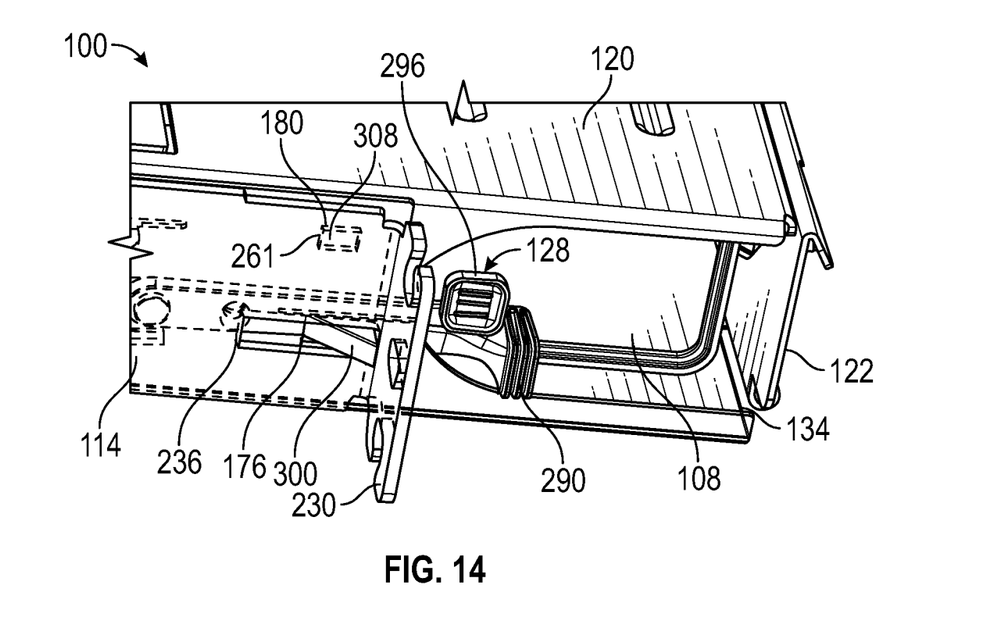
FIG. 14 is a detailed view of the extendable cable enclosure of FIG. 1, including the release lever engaged with an opening of the chassis.

The slide rails 114, 116 are secured to the respective rails 104, 106 of the rack 102, and the release levers 128, 130 are engaged or interlocked with the chassis 108 and the respective slide rails 114, 116. FIGS. 13 and 14 show the enclosure 100 in the retracted position and with the front cover 120 in the closed position, with both release levers 128, 130 engaged or interlocked with the chassis 108 and slide rails 114, 116. In the retracted and closed position, the engagement tab 300 extends through the slots 176, 236 in the chassis 108 and slide rail 114, with the flat engagement surface 304 abutting the flange 230 of the slide rail 114. Such engagement of the engagement tab 300 prevents the enclosure 100 from sliding outward relative to the slide rail 114. The engagement tab 308 extends through the slot 180 of the chassis 108 and at least partially into slot 261 of the front cover 120 (behind slide rail 114). Such engagement of the engagement tab 308 prevents the front cover 120 from pivoting upward into the open position. A similar engagement occurs on the right side of the enclosure 100 with slide rail 116, front cover 120 and release lever 130.

In operation, access to the interior of the enclosure 100 can be achieved in different ways or by using a combination of the options provided by the enclosure 100. Latches 124, 126 can be disengaged to swing open the front door 122 without extending the enclosure 100 relative to the rack 102 and slide rails 114, 116. If sufficient space is provided above the enclosure 100 in the rack 102, the front cover 120 can be opened without extending the enclosure 100 relative to the rack 102 and slide rails 114, 116. To open the front cover 120, flanges 296 on both release levers 128, 130 can be pressed inwardly towards each other. Due to the cantilever arrangement of the extension 284, inwardly pressing the flanges 296 disengages the engagement tab 308 from at least the slot 261 in the front cover 120 (and potentially the slot 180 of the chassis 108). As the engagement tab 308 is removed from the slot 261, the springs 314 bias the front cover 120 into the open position shown in FIG. 16. In the open position and with the front door 122 open, the enclosure 100 provides significantly more hand access to the interior of the enclosure 100 as compared to traditional enclosures. Lowering the front cover 120 into the closed position (e.g., FIG. 1) interlocks the engagement tab 308 with the slots 261 in the front cover 120 and prevents undesired opening of the front cover 120.

Figure 15:
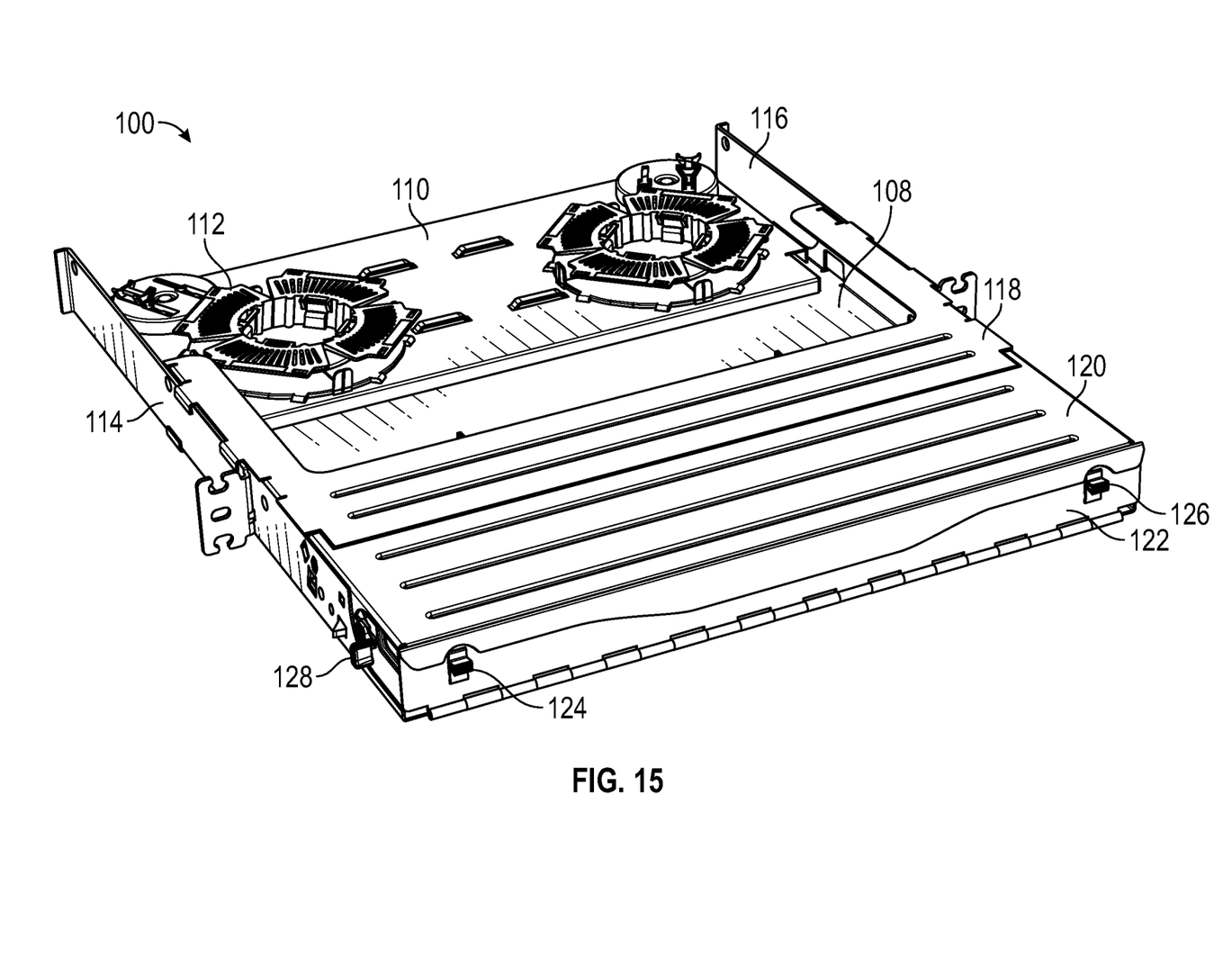
FIG. 15 is a left perspective view of the extendable cable enclosure of FIG. 1 in an extended position relative to the slide rails.
Figure 16:
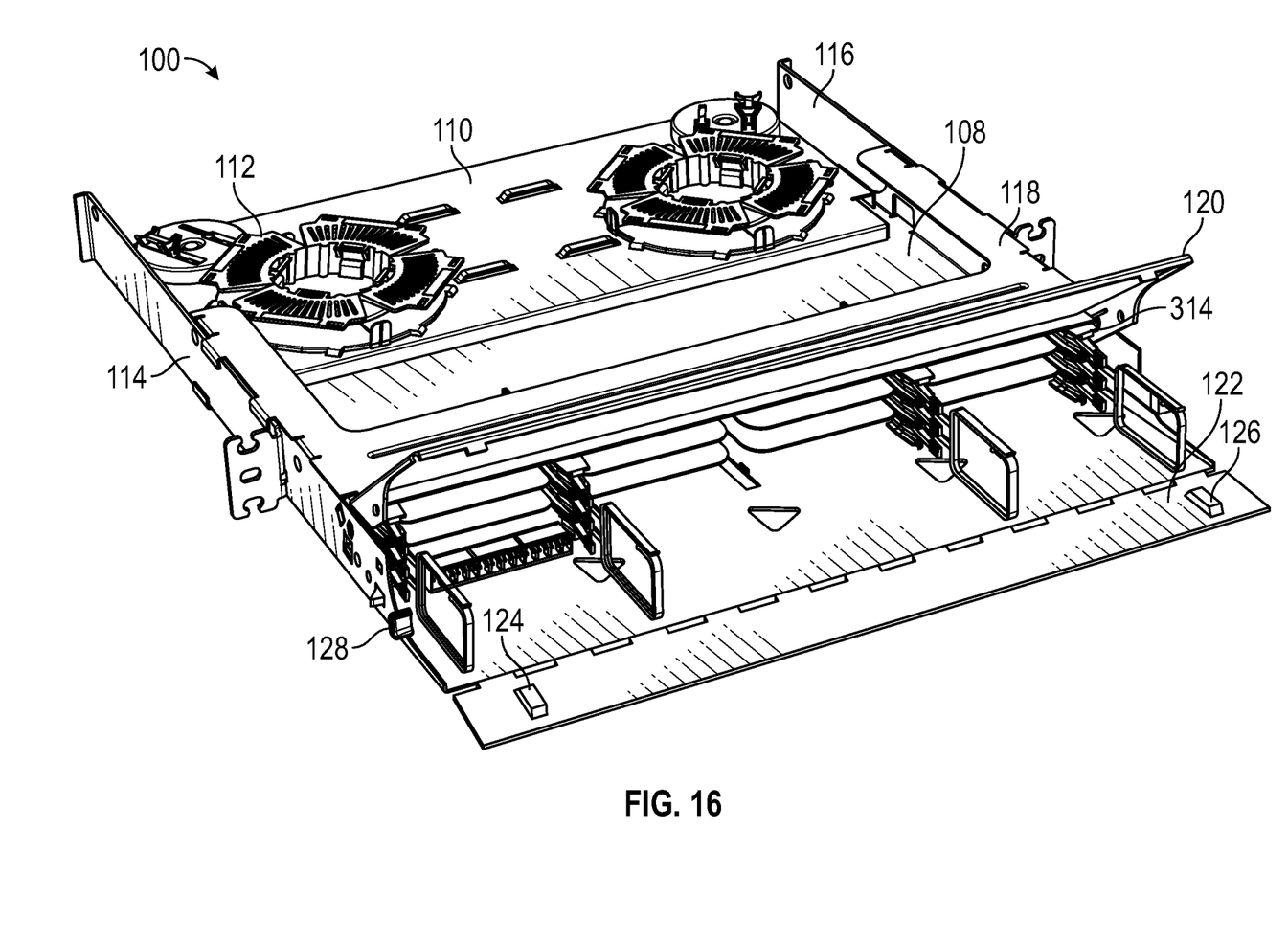
FIG. 16 is a left perspective view of the extendable cable enclosure of FIG. 1 in an extended position relative to the slide rails, and including the front cover and front door in open positions.

If sliding out of the enclosure 100 relative to the rack 102 (and the slide rails 114, 116) is desired, flanges 290 on both release levers 128, 130 can be pressed inwardly towards each other. Due to the cantilever arrangement of the extension 282, inwardly pressing the flanges 290 disengages the engagement tabs 300 from at least the slot 236 in the side rails 114, 116 (and potentially the slots 176, 178 in the chassis 108). Upon removal of the engagement tab 300 from the slots 236, the flanges 290 can be used as a gripping surface to pull the enclosure 100 forward and out of the rack 102. Sliding of the enclosure 100 as shown in FIGS. 15 and 16 provides clearance for the front cover 120 relative to the rack 102 space (if opening of the front cover 120 is desired). Flanges 204, 206 of the rear cover 118 act as stops or limits to restrict extension of the enclosure 100 beyond a predetermined distance. FIGS. 15 and 16 show the enclosure 100 in the extended position. Sliding the enclosure 100 inwardly between the sliding rails 114, 116 results in interlocking of the engagement tabs 300 with the slots 236 to lock the enclosure 100 in the retracted position.

Although the enclosure 100 is shown with two release levers 128, 130, one on each side of the assembly, it should be understood that the enclosure 100 could include only a single release lever 128 (or release lever 130) while still providing the same functionality of the enclosure 100. However, two release levers 128, 130 can act as a safety mechanism to ensure movement of the enclosure 100 and/or opening of the front cover 120 is not accidentally activated. As described herein, operating the sliding function of the enclosure 100 and opening of the front cover 120 can be performed independently from each other, depending on the needs of the user. Specifically, the separated cantilever extensions 282, 284 of the release levers 128, 130 allow for independent operation of the release levers 128, 130.

For example, the front door 122 can be opened without affecting the position of the enclosure 100 or the front cover 120, the front cover 120 can be opened without sliding the enclosure 100 out of the rack 102, the enclosure 100 can be slid out of the rack 102 and only the front door 122 can be opened, and the enclosure 100 can be slid out of the rack 102 and the front door 122 and front cover 120 can be opened. The configuration and positioning of the cantilever extensions 282, 284 also allows the user to potentially actuate both extensions 282, 284 substantially simultaneously in a convenient and easy manner to both extend the enclosure 100 and open the front cover 120. The enclosure 100 thereby provides flexibility and greater access to the interior of the enclosure 100. The design of the enclosure 100 also allows for a shorter overall enclosure 100 length (providing more room for cabling), a lighter enclosure 100 weight (providing for easier installation), fewer assembly parts (resulting in lower cost), fewer pinch points for cables (due to better ergonomics), fixed distances between connection points (providing for simpler cable routing and/or less on-chassis slack requirements), combinations thereof, or the like.

While exemplary embodiments have been described herein, it is expressly noted that these embodiments should not be construed as limiting, but rather that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The invention claimed is:

1. A cable enclosure, comprising:
a chassis;
a front cover coupled to the chassis;
a first slide rail and a second slide rail slidably coupled relative to the chassis;
a first release lever mounted to the chassis, the first release lever is capable of being positioned into a first position and a second position; and
a rear cover and a front door coupled to the chassis;
wherein in the first position, the first release lever engages the chassis to prevent sliding of the chassis and the front cover relative to the first and second slide rails;
wherein in the second position, the first release lever disengages the chassis to allow for sliding of the chassis and the front cover relative to the first and second slide rails; and wherein disengagement of the first release lever from the chassis allows for sliding of the chassis, the front cover, the rear cover, and the front door relative to the first and second slide rails.

2. The cable enclosure of claim 1, wherein the chassis is configured to support one or more spools for cable management or storage.

3. The cable enclosure of claim 1, wherein the first and second slide rails include a body with a mounting flange at a proximal end of the body, the mounting flange configured to be secured to supports associated with a rack.

4. The cable enclosure of claim 1, wherein the first release lever includes a body, a first cantilever extension extending from the body, and a second cantilever extension extending from the body.

5. The cable enclosure of claim 4, wherein the first cantilever extension includes a first engagement tab configured to engage with a slot formed in the first slide rail.

6. The cable enclosure of claim 5, wherein in the first position, the first engagement tab extends through the slot of the first slide rail and abuts a proximal mounting flange of the first slide rail to prevent sliding of the chassis and the front cover relative to the first and second slide rails.

7. The cable enclosure of claim 5, wherein in the second position, the first engagement tab is retracted from the slot of the first slide rail to provide clearance between the first engagement tab and the first slide rail, allowing for sliding of the chassis and the front cover relative to the first and second slide rails.

8. The cable enclosure of claim 4, wherein the second cantilever extension includes a second engagement tab configured to engage with a slot formed in the front cover, the second cantilever positionable in a third position and a fourth position.

9. The cable enclosure of claim 8, wherein in the third position, the second engagement tab extends through the slot of the front cover to prevent pivoting of the front cover relative to the chassis into an open position.

10. The cable enclosure of claim 8, wherein in the fourth position, the second engagement tab is retracted from the slot of the front cover to allow for pivoting of the front cover relative to the chassis into an open position.

11. The cable enclosure of claim 10, comprising a spring associated with the front cover, the spring biasing the front cover into the open position upon disengagement of the second engagement tab from the slot of the front cover.

12. The cable enclosure of claim 4, wherein the first and second cantilever extensions of the first release lever are independently actuated relative to each other.

13. The cable enclosure of claim 4, wherein the first cantilever extension connects to the body at a distal end of the first cantilever extension, and includes a flange at a proximal end of the first cantilever extension, the flange extending perpendicularly from the proximal end of the first cantilever extension.

14. The cable enclosure of claim 1, comprising a second release lever disposed on an opposing side of the chassis from the first release lever, wherein the first release lever engages and disengages relative to the first slide rail, and the second release lever engages and disengages relative to the second slide rail.

15. The cable enclosure of claim 1, wherein the first and second slide rails are mountable to a rack.

16. The cable enclosure of claim 1, wherein:
the first and second slide rails are directly slidably coupled to the chassis;

in the first position, the first release lever engages at least one of the first slide rail or the second slide rail to prevent sliding of the chassis and the front cover relative to the first and second slide rails;

in the second position, the first release lever disengages at least one of the first slide rail or the second slide rail to allow for sliding of the chassis and the front cover relative to the first and second slide rails.

17. The cable enclosure of claim 1, wherein:

the first release lever includes a tab;

in the first position, the tab of the first release lever passes through an opening of the chassis to engage with at least one of the first slide rail or the second slide rail to prevent sliding of the chassis and the front cover relative to the first and second slide rails; and in the second position, the tab of the first release lever passes through the opening of the chassis to disengage with at least one of the first slide rail or the second slide rail to allow for sliding of the chassis and the front cover relative to the first and second slide rails.

18. A method of cable management, comprising:

providing a cable enclosure, the cable enclosure including (i) a chassis, (ii) a front cover coupled to the chassis, (iii) a first slide rail and a second slide rail slidably coupled relative to the chassis, (iv) a first release lever mounted to the chassis, and (v) a rear cover and a front door coupled to the chassis;

positioning the first release lever into a first position to engage the first release lever with the chassis and prevent sliding of the chassis and the front cover relative to the first and second slide rails; and positioning the first release lever into a second position to disengage the first release lever from the chassis to allow for sliding of the chassis and the front cover relative to the first and second slide rails;

wherein disengagement of the first release lever from the chassis allows for sliding of the chassis, the front cover, the rear cover, and the front door relative to the first and second slide rails.

19. The method of claim 18, wherein the first release lever includes a body, a first cantilever extension extending from the body, and a second cantilever extension extending from the body.

20. The method of claim 19, wherein:

positioning the first release lever into the first position comprises extending a first engagement tab of the first cantilever extension through a slot of the first slide rail and abutting the first engagement tab against a proximal mounting flange of the first slide rail to prevent sliding of the chassis and the front cover relative to the first and second slide rails; and positioning the first release lever into the second position comprises retracting the first engagement tab from the slot of the first slide rail to allow for sliding of the chassis and the front cover relative to the first and second slide rails.

21. The method of claim 19, comprising:

positioning the second cantilever extension into a third position to insert a second engagement tab of the second cantilever extension through a slot formed in the front cover to prevent pivoting of the front cover relative to the chassis into an open position; and positioning the second cantilever extension into a fourth position to retract the second engagement tab from the slot of the front cover to allow for pivoting of the front cover relative to the chassis into the open position.

22. A cable enclosure system, comprising:

a rack including a first support structure and a second support structure; and a cable enclosure mounted to the rack, the cable enclosure including:

a chassis;

a front cover coupled to the chassis;

a first slide rail and a second slide rail slidably coupled relative to the chassis, the first slide rail fixedly coupled to the first support structure of the rack and the second slide rail fixedly coupled to the second support structure of the rack; and a first release lever mounted to the chassis, the first release lever is capable of being positioned into a first position and a second position; and a rear cover and a front door coupled to the chassis;

wherein in the first position, the first release lever engages the chassis to prevent sliding of the chassis and the front cover relative to the first and second slide rails; and wherein in the second position, the first release lever disengages the chassis to allow for sliding of the chassis and the front cover relative to the first and second slide rails; and wherein disengagement of the first release lever from the chassis allows for sliding of the chassis, the front cover, the rear cover, and the front door relative to the first and second slide rails.

\* \* \* \* \*